(12) United States Patent
Allman et al.

(10) Patent No.: US 6,951,787 B2
(45) Date of Patent: Oct. 4, 2005

(54) CAPACITOR WITH STOICHIOMETRICALLY ADJUSTED DIELECTRIC AND METHOD OF FABRICATING SAME

(75) Inventors: Derryl D. J. Allman, Camas, WA (US); Nabil Mansour, Colorado Springs, CO (US); Ponce Saopraseuth, Gresham, OR (US)

(73) Assignee: LSI Logic Corporation, Milpitas, CA (US)

( * ) Notice: Subject to any disclaimer, the term of this patent is extended or adjusted under 35 U.S.C. 154(b) by 33 days.

(21) Appl. No.: 10/382,709

(22) Filed: Mar. 6, 2003

(65) Prior Publication Data

US 2003/0157765 A1 Aug. 21, 2003

Related U.S. Application Data

(63) Continuation of application No. 09/573,137, filed on May 17, 2000, now Pat. No. 6,566,186.

(51) Int. Cl.$^7$ .................. H01L 21/8242; H01L 21/31
(52) U.S. Cl. .................. 438/239; 438/381; 438/786; 438/788; 438/792
(58) Field of Search .................. 438/778, 786–788, 438/791–792, 240, 239, 381, 253–256, 396–399

(56) References Cited

U.S. PATENT DOCUMENTS

| | | | | |
|---|---|---|---|---|
| 4,907,064 A | * | 3/1990 | Yamazaki et al. | 257/649 |
| 5,652,172 A | * | 7/1997 | Yung-Sung et al. | 438/704 |

* cited by examiner

*Primary Examiner*—Mary Wilczewski
*Assistant Examiner*—Toniae M. Thomas
(74) *Attorney, Agent, or Firm*—Luedeka, Neely & Graham, P.C.

(57) ABSTRACT

A capacitor and a capacitor dielectric material are fabricated by adjusting the amount of an ionic conductive species, such as hydrogen, contained in the capacitor dielectric material to obtain predetermined electrical or functional characteristics. Forming the capacitor dielectric material from silicon, nitrogen and hydrogen allows a stoichiometric ratio control of silicon to nitrogen to limit the amount of hydrogen. Forming the capacitor by dielectric material plasma enhanced chemical vapor deposition (PECVD) allows hydrogen bonds to be broken by ionic bombardment, so that stoichiometric control is achieved by controlling the power of the PECVD. Applying a predetermined number of thermal cycles of temperature elevation and temperature reduction also breaks the hydrogen bonds to control the amount of the hydrogen in the formed capacitor dielectric material.

8 Claims, 6 Drawing Sheets

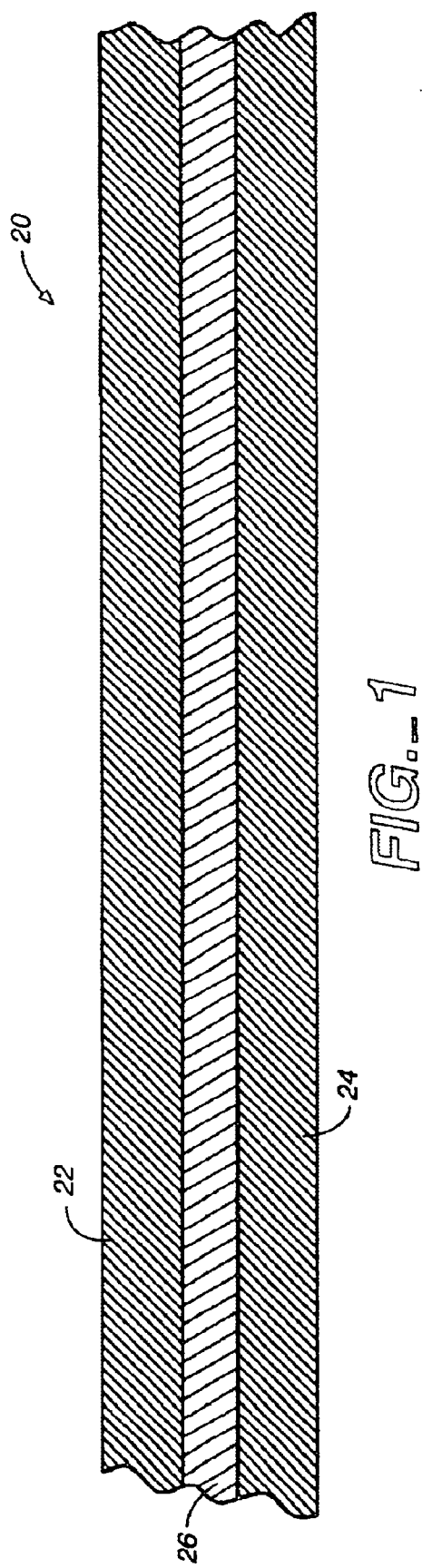

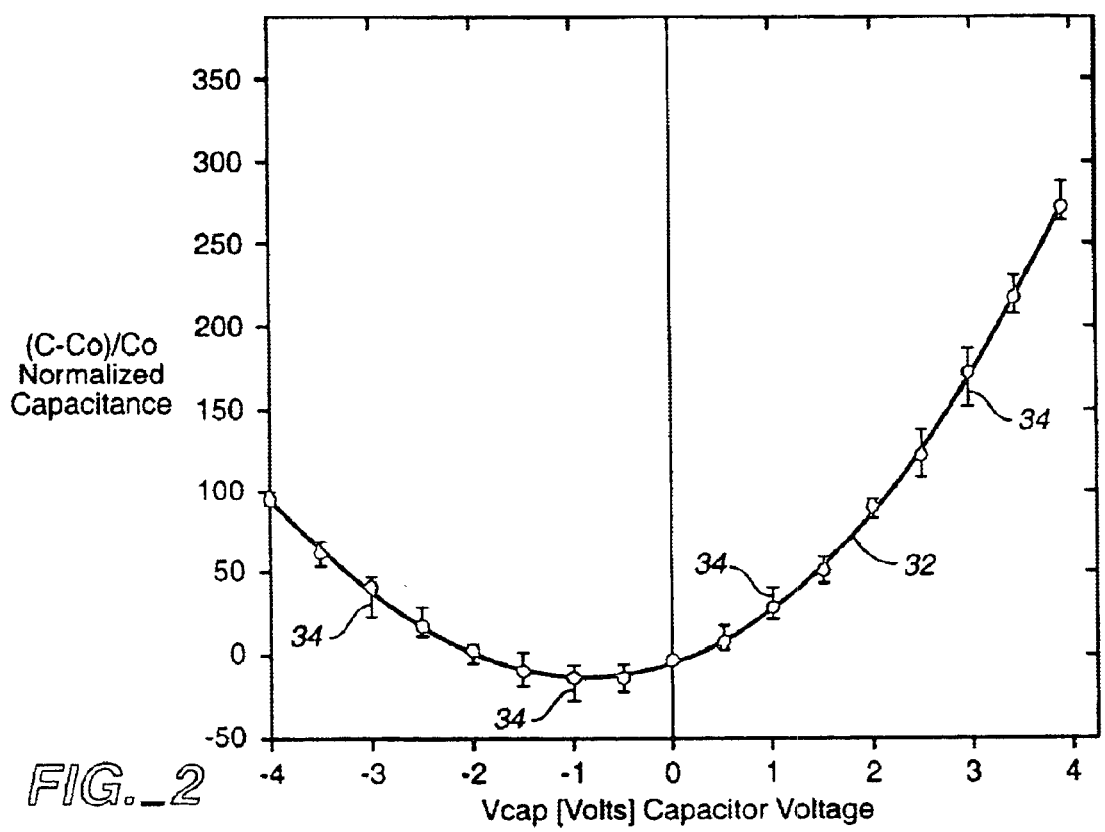
FIG._2
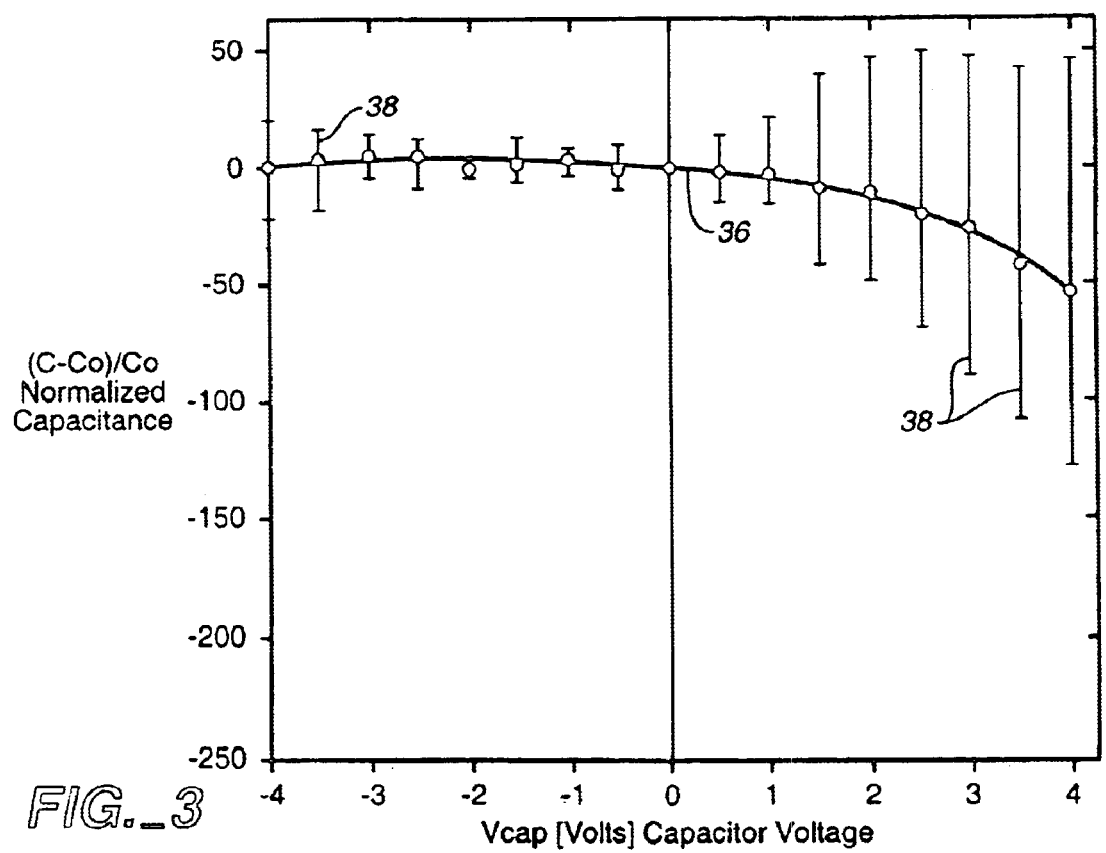
FIG._3

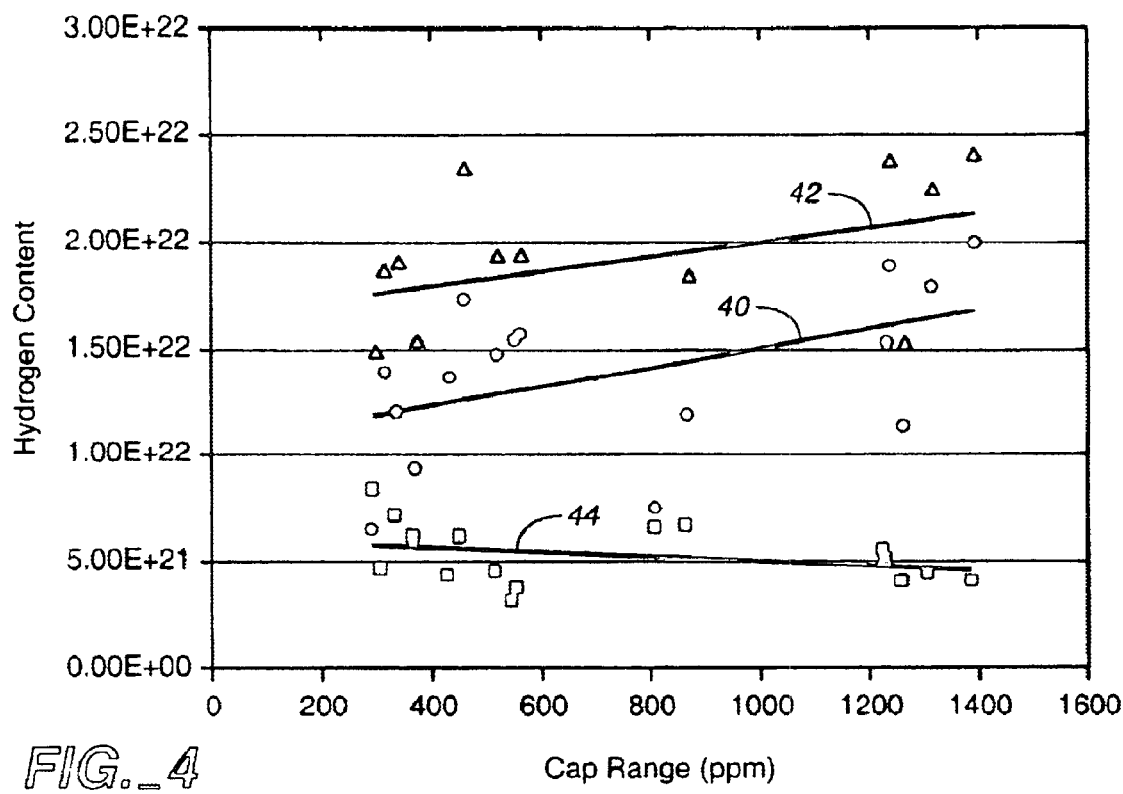
FIG._4
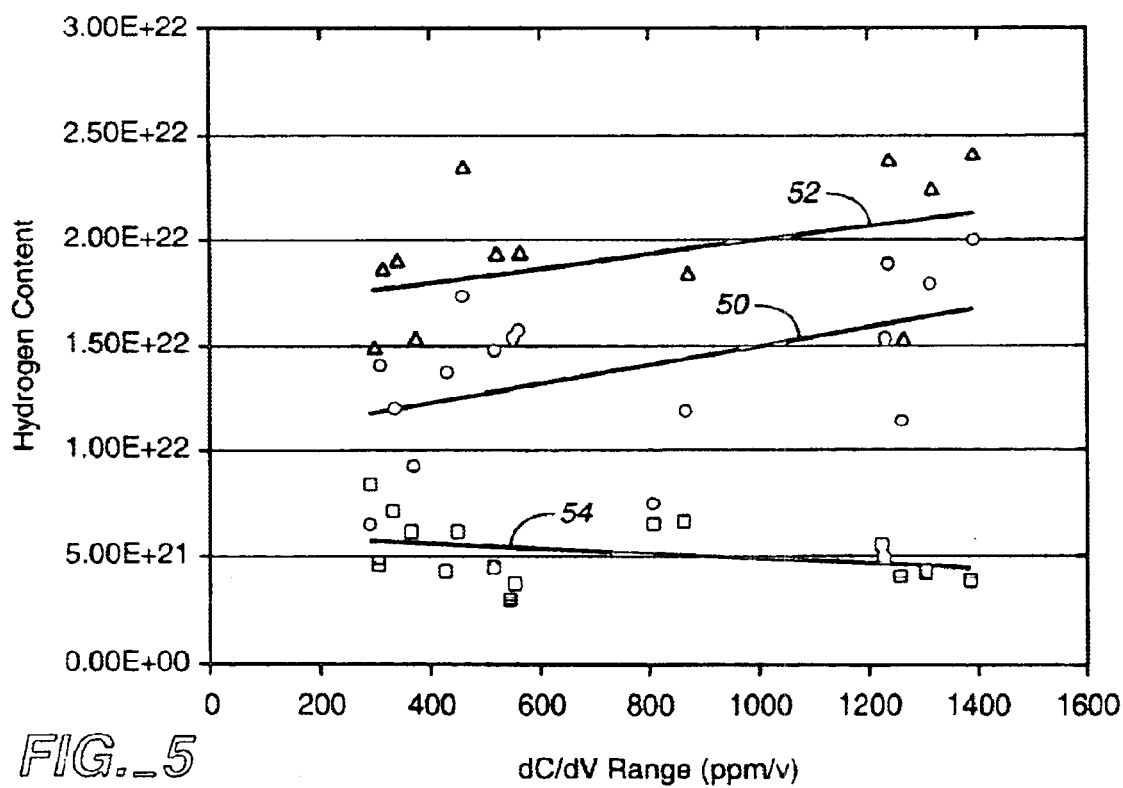
FIG._5

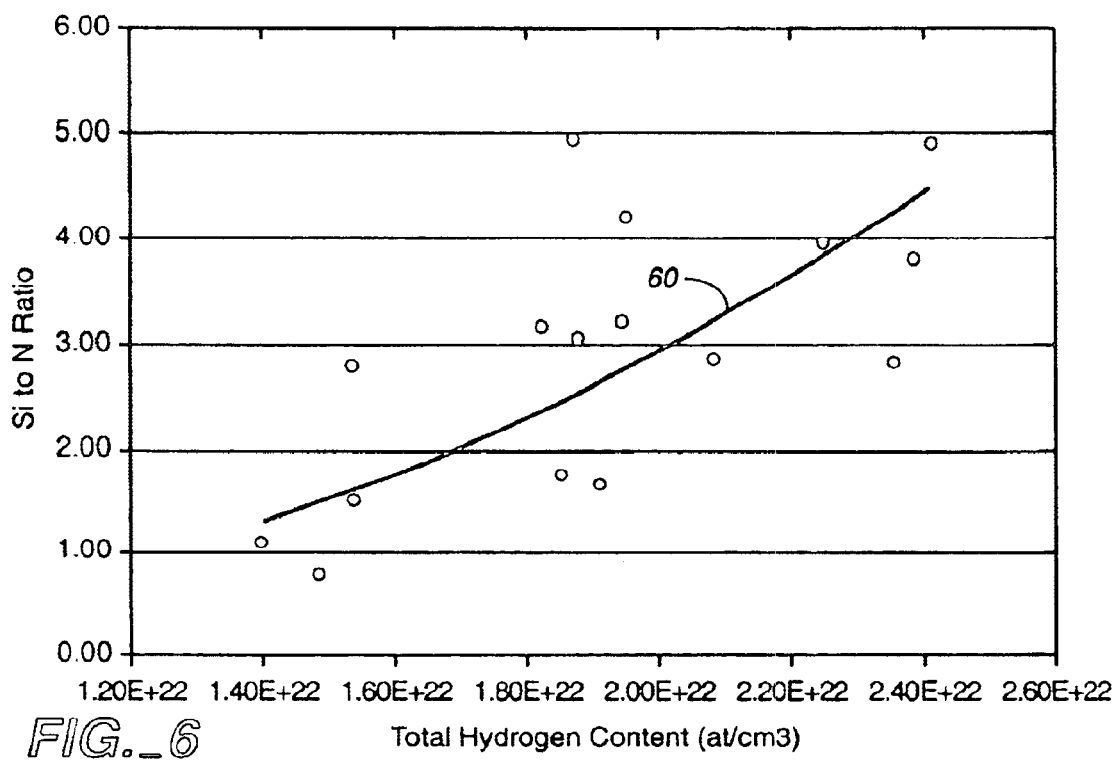
FIG._6
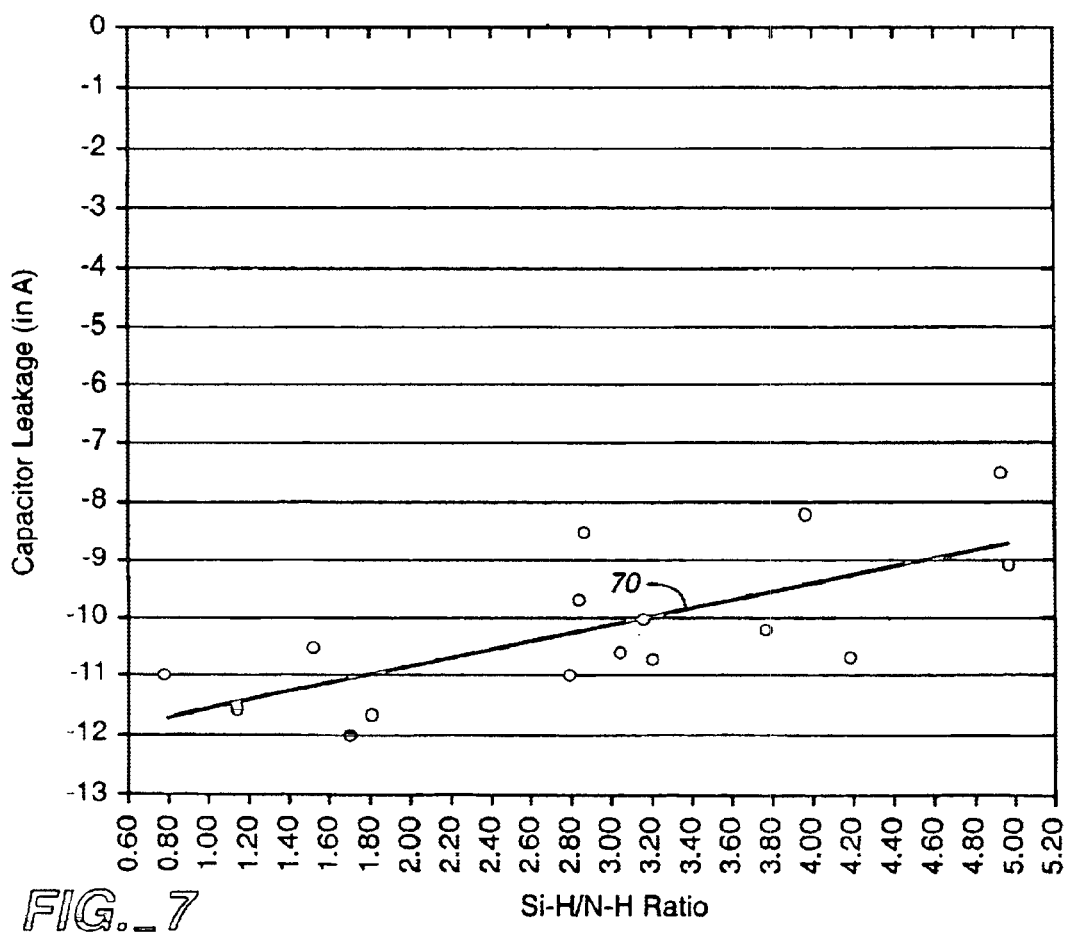
FIG._7

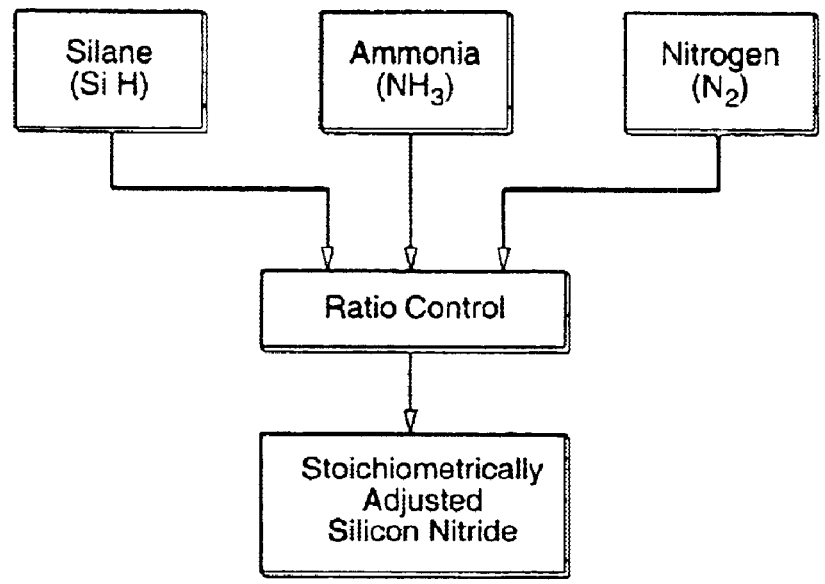
FIG._8
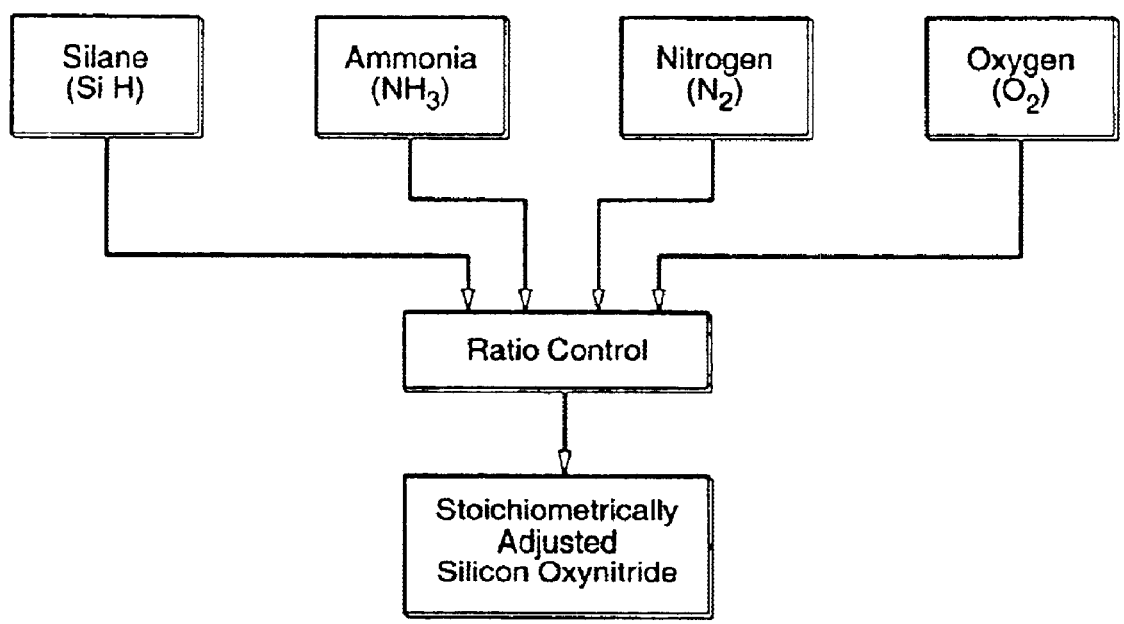
FIG._9

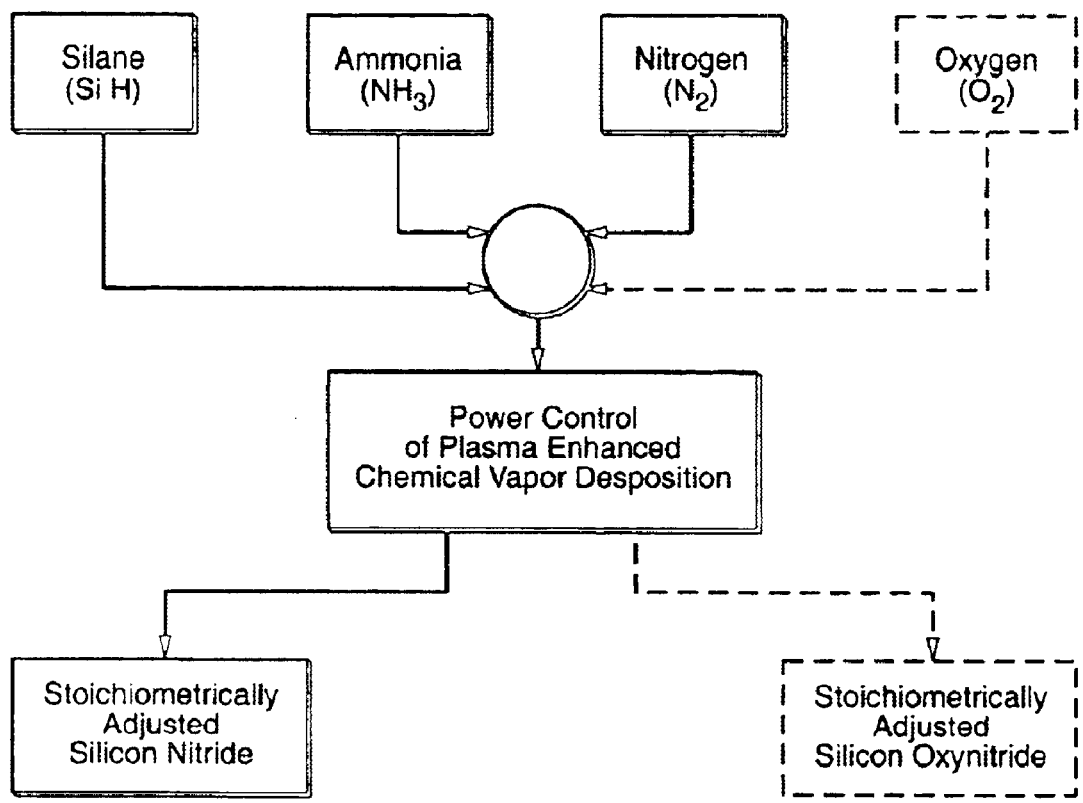
FIG._10
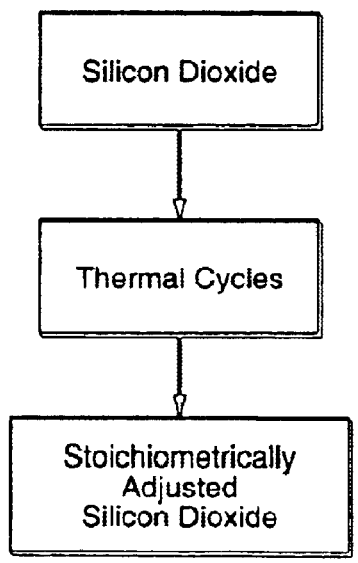
FIG._11

CAPACITOR WITH STOICHIOMETRICALLY ADJUSTED DIELECTRIC AND METHOD OF FABRICATING SAME

This is a continuation divisional of application Ser. No. 09/573,137 filed 2000 May 17 now U.S. Pat. No. 6,566,186.

CROSS-REFERENCE TO RELATED INVENTIONS

This invention is related to the following inventions, all of which are assigned to the assignee of the present invention: High Aspect Ratio Metal-to-Metal Linear Capacitor for an Integrated Circuit, U.S. patent application Ser. No. 09/052,851, filed Mar. 31, 1998; Method of Electrically Connecting and Isolating Components with Vertical Elements Extending between Interconnect Layers in an Integrated Circuit, U.S. patent application Ser. No. 09/052,793, filed Mar. 31, 1998; Vertical Interdigitated Metal-Insulator-Metal Capacitor for an Integrated Circuit, U.S. patent application Ser. No. 09/219,655, filed Dec. 23, 1998; Method of Forming and Electrically Connecting a Vertical Interdigitated Metal-Insulator-Metal Capacitor Extending between Interconnect Layers in an Integrated Circuit, U.S. patent application Ser. No. 09/221,023, filed Dec. 23, 1998; Interconnect-Integrated Metal-Insulator-Metal Capacitor and Method of Fabricating Same, U.S. patent application Ser. No. 09/559,934, filed Apr. 27, 2000; Interconnect-Embedded Integrated Metal-Insulator-Metal Capacitor and Method of Fabricating Same, U.S. patent application Ser. No. 09/496,971, filed Feb. 2, 2000; Capacitor with Multiple-Component Dielectric and Method of Fabricating Same; U.S. patent application Ser. No. 09/573,123, filed concurrently herewith; and Encapsulated-Metal Vertical-Interdigitated Capacitor and Damascene Method of Manufacturing Same; U.S. patent application Ser. No. 09/525,489, filed Mar. 15, 2000. The disclosures of these aforementioned U.S. patent applications are hereby incorporated herein by this reference.

FIELD OF THE INVENTION

This invention relates to electrical capacitors. More particularly, the present invention relates to a new and improved capacitor having a dielectric material which has been stoichiometrically formed or treated to optimize or improve the electrical or functional characteristics of the capacitor, such as its capacitance value variation or tolerance, its change-in-capacitance per change-in-voltage (dC/dV), or its leakage current. Optimizing these characteristics achieves more reliable and predictable functionality, as well as precise operating characteristics, thereby making the capacitor more suitable for both analog and digital circuit functions when incorporated within an integrated circuit (IC).

BACKGROUND OF THE INVENTION

Capacitors are commonly employed in ICs for a variety of purposes, such as to condition signals, to store electrical charge, to block DC voltage levels, and to stabilize power supplies. In memory ICs, a capacitor is used to hold enough charge to represent a detectable logic state.

Polysilicon is typically used to construct the electrode plates of the capacitor in a substrate of the IC. The diffusion and doping characteristics of polysilicon result in variable capacitance characteristics, in which the capacitance value varies relative to the voltage level applied to the capacitor and the temperature experienced by the capacitor. Despite the variable characteristics of polysilicon capacitors, the capacitance variation is not of primary concern in digital memory ICs. Memory capacitors are required only to accept charge, to hold some or all of the charge for a finite time period and then discharge, all in a reliable manner. Furthermore, since polysilicon is also used to fabricate other components of the IC, such as transistors and conductors, the plates of the capacitors can be formed simultaneously with the other components of the IC.

In analog and mixed signal circuit applications, on the other hand, capacitors are frequently used as impedance elements whose response characteristic must be linear. If the impedance of the capacitor is not fixed and reliably ascertainable, the capacitance response of the capacitor relative to voltage will vary non-linearly, causing unacceptable variations in the performance of the analog or mixed signal circuit.

Application specific integrated circuits (ASICs) sometimes combine analog circuitry with digital circuitry on the same substrate. In such applications, the fabrication of capacitors has become somewhat problematic. Polysilicon is a semiconductor, which is not the best material to use as an electrode to form a capacitor. A space charge layer forms in the doped polysilicon and adversely affects the capacitance vs. voltage response (linearity) and the frequency response of the capacitor. When a metal material is used for the electrode, however, no space charge layer exists.

Many contemporary ICs employ multiple layers of interconnects, as an adjunct of their miniaturization. Interconnects are layers of separate electrical conductors which are formed overlying the substrate and which electrically connect various functional components of the IC. Because of space and volume considerations in ICs, attention has been focused upon the effective use of the space between the interconnect layers. Normally the space between the interconnect layers is occupied by an insulating material, known as an intermetal dielectric (IMD). One effective use for the space between the interconnect layers is to form capacitors in this space using the interconnect layers. The previously referenced U.S. patent applications focus on different techniques for combining capacitors with the conductors of the interconnect layers to achieve desirable effects within the IC.

Because the conductors of the interconnect layers are of metal construction, the capacitors formed between the interconnect layers are preferably of a metal-insulator-metal (MIM) construction. A MIM capacitor has metal plates, usually formed on the metal conductors of the interconnect layers. The fourth and fifth above identified patent applications describe techniques for forming the metal capacitor plates with the conductors of the interconnect layers. The additional benefit of MIM capacitors is that they possess a higher degree of linearity and an improved frequency response. Unlike polysilicon capacitors, MIM capacitors incorporated within the interconnect levels are unobtrusive to the underlying digital components or circuitry.

The use of a MIM capacitor within the interconnect levels can also reduce the size of the overall IC structure because the digital circuitry exists under the capacitor, instead of beside it. Additionally, MIM capacitors are readily fabricated as part of the interconnect layers without a significant increase in the number of process steps or in the manufacturing costs. Connecting the MIM capacitors in the interconnect layers to the appropriate components of the IC is relatively easily accomplished by post-like or plug-like "via interconnects" that extend between the interconnect layers as needed.

However, even the more linear MIM capacitors are susceptible to non-linear performance under the influence of different electrical and physical conditions, and even relatively small deviations from the expected and desired performance may be sufficient to diminish the effective use of such capacitors in precise linear or analog circuits or in digital circuits.

It is with respect to these and other background considerations that the present invention has evolved.

SUMMARY OF THE INVENTION

The improvements of the invention relate to the discovery that the density of the film which represents the bonding network along with the incorporation of bonded and free hydrogen in capacitor dielectric materials, such as silicon nitride, silicon oxynitride or silicon dioxide, can induce undesirable electrical and functional effects. Such undesirable effects include excessive variability or tolerance in the electrical characteristics of the capacitor, excessive change-in-capacitance per change-in-voltage (dC/dV, referred to as the linear response) characteristics, and excessive leakage current.

The present invention makes use of this discovery by controlling the stoichiometry of the dielectric, the dielectric deposition conditions, the network bonding (i.e. density) and the hydrogen incorporation. In the case where the dielectric film is comprised of either an oxide or oxynitride film the density and hydrogen content can be manipulated by post deposition thermal anneals.

By eliminating excess hydrogen within the capacitor dielectric material and controlling the stoichiometry of the dielectric film, improvements or optimizations are obtained in the electrical and functional characteristics of the capacitor dielectric material. Such characteristics include the capacitor's capacitance density, its linear response (dC/dV), and its leakage current.

The improvements of the present invention also relate to the recognition that the density and the amount of bonded and free hydrogen in a silicon nitride or silicon oxynitride capacitor dielectric material may be indirectly controlled and optimized. Such control and optimization achieve the desirable electrical and functional effects by controlling the ratio of silicon and nitrogen used in forming the silicon nitride or silicon oxynitride capacitor dielectric material.

These and other improvements are achieved in methods of fabricating a capacitor dielectric material in a capacitor. One fabrication aspect of the invention includes forming the capacitor dielectric material to contain hydrogen, and adjusting the composition of the capacitor dielectric material by controlling the stoichiometry of the capacitor dielectric material in order to adjust the amount of the hydrogen contained in the capacitor dielectric material and to obtain predetermined electrical or functional characteristics of the capacitor. Preferably, the capacitor dielectric material is formed from substances including silicon, nitrogen and hydrogen. Also, a stoichiometric ratio of silicon to nitrogen is preferably controlled to limit the amount of hydrogen in the capacitor dielectric material. The ratio of silicon to nitrogen is preferably approximately 1.0 or less, or even more preferably approximately 0.75.

Another fabrication aspect of the invention relates to forming the capacitor dielectric material to include hydrogen bonds by depositing the substances by using plasma enhanced chemical vapor deposition, breaking some of the hydrogen bonds by ionic bombardment to allow the hydrogen from the broken bonds to escape from the capacitor dielectric material, and controlling the amount of the hydrogen in the formed capacitor dielectric material by controlling the power and amount of ionic bombardment.

Still another fabrication aspect of the invention involves breaking hydrogen bonds to the capacitor dielectric material by applying at least one thermal cycle of temperature elevation and temperature reduction of the capacitor dielectric material, and controlling the amount of the hydrogen in the formed capacitor dielectric material by controlling the number and extent of the applications of thermal cycles to the capacitor dielectric material.

Broader aspects of the present invention apply to capacitor dielectric materials containing substances which, like hydrogen, have a tendency to promote ionic conduction in the capacitor dielectric material. Aspects of the present invention also relate to capacitors having dielectric materials formed by the method aspects of the present invention.

A more complete appreciation of the present invention and its scope, and the manner in which it achieves the above noted improvements, can be obtained by reference to the following detailed description of presently preferred embodiments of the invention taken in connection with the accompanying drawings, which are briefly summarized below, and the appended claims.

BRIEF DESCRIPTION OF THE DRAWINGS

FIG. 1 is a partial, vertical cross-sectional view of a capacitor having dielectric material which has been stoichiometrically adjusted in accordance with the present invention.

FIG. 2 is a normalized graph of exemplary change-in-capacitance per change-in-voltage (dC/dV) characteristics of silicon nitride used as the dielectric material of a capacitor.

FIG. 3 is a normalized graph of exemplary change-in-capacitance per change-in-voltage (dC/dV) characteristics of silicon dioxide used as the dielectric material of a capacitor.

FIG. 4 is a graph illustrating an exemplary change in the range of the capacitance values across the operating voltage relative to hydrogen content of silicon nitride capacitor dielectric material.

FIG. 5 is a graph illustrating an exemplary range of dC/dV characteristics of a capacitor relative to hydrogen content of a silicon nitride capacitor dielectric material.

FIG. 6 is a graph illustrating the relationship between total hydrogen content and a ratio of silicon to nitrogen in a silicon nitride capacitor dielectric material.

FIG. 7 is a graph illustrating an exemplary amount of capacitor leakage current relative to a ratio of silicon-hydrogen bonds to silicon-nitrogen-bonds of silicon nitride capacitor dielectric material.

FIG. 8 is a simplified block flow diagram illustrating the formation of stoichiometrically adjusted silicon nitride from silane, ammonia and nitrogen, in accordance with the present invention.

FIG. 9 is a simplified block flow diagram illustrating the formation of stoichiometrically adjusted silicon oxynitride from silane, ammonia, nitrogen and oxygen, in accordance with the present invention.

FIG. 10 is a simplified block flow diagram illustrating the formation of stoichiometrically adjusted silicon nitride and stoichiometrically adjusted silicon oxynitride (shown in dashed lines) by controlling and adjusting the power applied during plasma enhanced chemical vapor deposition of the capacitor dielectric material, in accordance with the present invention.

FIG. 11 is a simplified block diagram illustrating the formation of stoichiometrically adjusted silicon dioxide by applying repetitive thermal cycles to the silicon dioxide after it has been formed as the capacitor dielectric material, in accordance with the present invention.

DETAILED DESCRIPTION

A capacitor 20 which embodies the present invention is shown in FIG. 1. The capacitor 20 may be incorporated in an integrated circuit (IC) (not shown), either in or on a substrate of the IC or as part of the interconnect layers. The capacitor 20 has a pair of electrode plates 22 and 24, hereinafter referred to as the upper and lower plates, respectively. The plates 22 and 24 are separated by adjacent capacitor dielectric material 26. The capacitor dielectric material 26 has been stoichiometrically adjusted to reduce the bonded hydrogen content, in accordance with the present invention, as is discussed in greater detail below.

The upper and lower plates 22 and 24 are preferably formed of a metal material, or in appropriate circumstances, a semiconductor material. In the case were the upper and lower plates 22 and 24 are formed substantially by metal material, such as copper or aluminum conductors of an interconnect layer, the electrical and functional characteristics of the capacitor 20 will be dictated primarily by the choice and content of the capacitor dielectric material 26. In the case where the upper and lower plates 22 and 24 are formed of semiconductor or other principally non-metallic material, the material of the plates 22 and 24 should be selected to coordinate with the capacitor dielectric material 26 in enhancing the electrical and functional characteristics of the capacitor.

The composition of the capacitor dielectric material 26 can be adjusted to optimize or improve certain functional and electrical characteristics of the capacitor 20. For example, one characteristic which may be improved by adjustment of the capacitor dielectric material 26 is the change-in-capacitance per change-in-voltage (dC/dV) characteristic of the capacitor. FIG. 2 illustrates the typical dC/dV characteristic of a capacitor having metal plates with a single dielectric material formed of silicon nitride. As shown in FIG. 2, a curved line 32 shows that the capacitance value varies according to the voltage applied across the capacitor plates. The fact that the line 32 is curved demonstrates that the response characteristics of the capacitor are nonlinear. Vertical bars 34 at points along the curve 32 indicate the statistics of the measurements made for capacitance at each voltage selection. FIG. 2 shows the change in the mean of normalized capacitance over the voltage range of interest. The vertical bars 34 show the range in normalized capacitance measured at each voltage setting. Smaller vertical bars 34 indicate that the response characteristics of the capacitor dielectric material 26 (FIG. 1) are fairly consistent along the curve 32, even though the curve 32 itself is nonlinear.

FIG. 3 illustrates the typical dC/dV characteristics of a capacitor having metal plates with a single dielectric material formed of silicon dioxide. In the situation illustrated in FIG. 3, curve 36 generally represents the change in capacitance relative to the change in voltage across the capacitor plates. Unlike curve 32 shown in FIG. 2, curve 36 shown in FIG. 3 is considerably more linear. Therefore, the response characteristics of a capacitor formed with silicon dioxide capacitor dielectric material should be more linear than the response characteristics of a capacitor formed with silicon nitride capacitor dielectric material (FIG. 2). Vertical bars 38 at points on the curve 36 show the range in measured normalized capacitance values at each voltage setting. Some of vertical bars 38 show a considerable variation in value, indicating that the curve 36 is subject to a considerable degree of variability, particularly when the capacitor is subject to positive voltages.

It has been discovered that the characteristics shown in FIGS. 2 and 3, and others, are directly influenced and attributable to the extent of hydrogen within and the stoichiometry of silicon nitride and silicon oxynitride capacitor dielectric materials. FIG. 4 shows the change or range in the mean values of normalized capacitance ("capacitor range") over the entire voltage range of the measurement as shown in FIGS. 2 and 3. This change, or range, indicates the degree of linearity of a capacitor relative to hydrogen concentration.

Curve 40 of FIG. 4 shows that the capacitor range increases in direct relationship to the total amount of bonded hydrogen in the capacitor dielectric material. Curve 40 represents the total bonded hydrogen within silicon nitride capacitor dielectric material. As the total amount of bonded hydrogen decreases, the capacitor range also decreases, indicating that the linearity of the capacitor improves with diminished hydrogen content. A reduced tolerance or degree of variability is desired, because capacitors of the predicted size can be more reliably fabricated, and their function within the electronic circuit is more predictable.

Curve 42 shown in FIG. 4, illustrates nitrogen-hydrogen bonds in the capacitor dielectric material. As a number of nitrogen-hydrogen bonds decreases, so does the capacitor range. On the other hand, curve 44 shown in FIG. 4, which illustrates the number of silicon-hydrogen bonds in the capacitor dielectric material, shows that the number of silicon-hydrogen bonds have little effect on the capacitor range, because the slope of curve 44 is almost flat. Thus, curves 40 and 42 show that reducing the total hydrogen bond content and the nitrogen-hydrogen content of the capacitor dielectric material will reduce the capacitor range.

A situation similar to that shown in FIG. 4 is illustrated in FIG. 5. FIG. 5 shows the range or change in slope (dC/dV) of the line at each voltage setting. The expected range of dC/dV characteristics relative to the hydrogen content of silicon nitride capacitor dielectric material is shown in FIG. 5. Curve 50 illustrates total hydrogen content, which when reduced, results in a reduction in the range of dC/dV characteristics. Curve 52 shows the contribution of nitrogen-hydrogen bonds to the dC/dV characteristics. Reducing the number of nitrogen-hydrogen bonds also reduces the range of dC/dV values. On the other hand, curve 54, which represents the contribution of silicon-hydrogen bonds, again illustrates that a relatively minimal effect on the dC/dV range results because of silicon-hydrogen bonds. It is desirable to reduce the range of dC/dV characteristics of capacitors, because doing so results in capacitor functionality which is more closely related to the expected and predicted performance in the electrical circuit in which the capacitor is used.

It is believed that the less desirable electrical and functional characteristics of a capacitor which result from a relatively high hydrogen content of its capacitor dielectric material (at least in the case of silicon nitride and silicon oxynitride), occur because of the addition of hydrogen to the structural network of the dielectric material. Free or weekly bonded hydrogen is an ion that can diffuse through the dielectric material under an electric field. The hydrogen becomes an ionic current carrying species which can reduce the dielectric constant of the material and the capacitance value of the capacitor. Furthermore, an increase in ionic conduction can introduce the variability in the normalized capacitance range and dC/dV characteristics as illustrated in FIGS. 4 and 5 and by the magnitude of the vertical bars 34 and 38 shown in FIGS. 2 and 3, respectively. In summary, greater ionic conduction is related to a higher hydrogen content in a capacitor dielectric material, and the greater ionic conduction results in the less desirable electrical and functional characteristics evidenced by larger values in capacitor range and dC/dV values shown for silicon nitride and oxynitride films. The same and similar electrical and functional characteristics are also believed to occur in other types of capacitor dielectric material, and these characteristics are also believed to be influenced by the hydrogen content in the capacitor dielectric material.

A technique for controlling the amount of hydrogen content in silicon nitride and silicon oxynitride capacitor dielectric material is to control the silicon to nitrogen ratio when forming the capacitor dielectric material. Curve 60 shown in FIG. 6 illustrates that the total hydrogen content is directly related to the silicon to nitrogen ratio. If the silicon to nitrogen ratio is reduced, the total hydrogen content is likewise reduced. Reducing the silicon to nitrogen ratio improves the electrical and functional characteristics, by reducing the hydrogen content.

Further confirmation of the importance of reducing the hydrogen content of the capacitor dielectric material is shown in FIG. 7, where a ratio of silicon-hydrogen bonds to nitrogen-hydrogen bonds is related to capacitor leakage current as shown by curve 70. Reducing the ratio of silicon-hydrogen bonds to nitrogen-hydrogen bonds significantly decreases the leakage current of the capacitor dielectric material. Of course, a decreased capacitor leakage current characteristic is desirable for capacitor dielectric material because the capacitor dielectric material is more effective in preventing ionic conduction and in achieving electrical field charge storage.

Curve 60, shown in FIG. 6, illustrates that a technique of controlling the hydrogen content of the capacitor dielectric film may be achieved by controlling the ratio of silicon to nitrogen in the capacitor dielectric material. The ratio of the silicon-hydrogen bonds to the nitrogen-hydrogen bonds is directly related to the ratio of silicon to nitrogen. By lowering the ratio of silicon to nitrogen, the total hydrogen content is diminished. A ratio of silicon to nitrogen of approximately 1.0 or less obtains very desirable electrical and functional characteristics in capacitor dielectric material. An extension of curve 60 indicates that a silicon to nitrogen ratio of approximately 0.75 is the absolute or best attainable stoichiometric ratio for minimizing the hydrogen content.

One method of adjusting the stoichiometry of a capacitor dielectric material is illustrated in FIG. 8. In this case, the ratio of silicon to nitrogen used in forming the silicon nitride is controlled, by controlling the relative proportions of silane, ammonia and nitrogen gases that are used in a standard semiconductor silicon nitride deposition process. The amount of the silicon in the silicon nitride is established by the silane. The amount of nitrogen is established by controlling the amounts of ammonia and nitrogen. By controlling the relative amounts of silane, ammonia and nitrogen, the desired silicon to nitrogen ratio is achieved. Of course, by controlling the silicon to nitrogen ratio to a relatively low value, a reduced amount of hydrogen is present in the silicon nitride. Silicon nitride with reduced amount of hydrogen content achieves the improvements and optimizations in electrical and functional characteristics of the capacitor.

A similar method of controlling the ratio of silane, ammonia, nitrogen and oxygen to obtain a silicon oxynitride is shown in FIG. 9. Controlling the amounts of these four gases in order to obtain the desired ratio of silicon to nitrogen in the resultant silicon oxynitride is performed in the same manner as has been described in conjunction with FIG. 8, taking into account the difference in chemistry of silicon oxynitride compared to silicon nitride.

Another technique for obtaining the desired silicon to nitrogen ratio in either silicon nitride or silicon oxynitride is to control the power of the plasma enhanced chemical vapor deposition process for forming silicon nitride and silicon oxynitride dielectrics. The silicon nitride is formed by using plasma enhanced chemical vapor deposition (PECVD) in the conventional manner, except for controlling the power to obtain the desired amount of hydrogen in the formed capacitor dielectric material. Silicon oxynitride is also formed in the conventional manner using PECVD, except for controlling the power to obtain the desired hydrogen content in the formed capacitor dielectric material. Increasing the low frequency power or a combination of both low and high frequency powers used to deposit the film of silicon nitride or silicon oxynitride increases the induced DC bias, which is accompanied by an increase in ionic bombardment. More extensive ionic bombardment causes a densification of the film as the film is deposited. The ionic bombardment breaks the bonds of hydrogen to the silicon and to the nitrogen and thus allows the hydrogen to separate from the silicon and nitrogen during the formation of the silicon nitride. A similar circumstance exists with respect to breaking the bonds of the hydrogen to silicon and to nitrogen during the formation of silicon oxynitride. Thus with greater power applied during plasma enhanced chemical vapor deposition, a greater number of hydrogen bonds are broken thus releasing the hydrogen from the silicon nitride and silicon oxynitride.

In the case of silicon dioxide used as capacitor dielectric material, an adjustment in the composition of the silicon dioxide material will result in substantially reducing the variance and values represented by the bars 38 of the graph 36, shown in FIG. 3. A technique for adjusting the composition of the silicon dioxide material to reduce the variance in values is illustrated in FIG. 11. In this technique, the silicon dioxide is first formed using standard semiconductor fabrication technique for forming silicon dioxide. Thereafter the silicon dioxide is subjected to at least one and preferably a multiple number of thermal cycles using a nitrogen or reduced pressure environment. Each thermal cycle is accomplished by raising the temperature of the silicon oxide to approximately 400 degrees Celsius, and then allowing it to cool to a considerably lesser temperature, for example approximately 150 degrees Celsius. With each thermal cycle, hydrogen bonds to the silicon are broken, and some of the hydrogen contained within the silicon dioxide is freed and replaced by nitrogen, thereby reducing the overall hydrogen content of the silicon dioxide. The diminished hydrogen content of the silicon dioxide causes less variability of its dC/dV characteristics, as would be illustrated by smaller vertical bars 38, shown in FIG. 3. Reducing the range in the dC/dV characteristics makes the capacitor more predictable in performance.

Reducing the hydrogen content of capacitor dielectric material, such as silicon nitride, silicon oxynitride or silicon dioxide, improves or optimizes the electrical and functional characteristics of the capacitor. Controlling or optimizing the stoichiometry of the capacitor dielectric material effectively achieves control over the hydrogen content. By keeping the silicon to nitrogen ratio low, about 1.0 or less, and preferably at approximately 0.75, the hydrogen content is optimally diminished to achieve the best improvements in electrical and functional characteristics. In the case of silicon dioxide, repetitive thermal cycles break the hydrogen bonds and free the hydrogen from the capacitor dielectric material to achieve a lower range in the dC/dV values for a silicon dioxide film. Controlling the low and high frequency power associated with plasma enhanced chemical vapor deposition to achieve a predetermined level of breakage of the hydrogen bonds by higher energy ion bombardment also reduces the hydrogen content and adjusts the composition of the capacitor dielectric material. Other techniques for controlling the relative proportion of the components of capacitor dielectric material to reduce the hydrogen content, to control the number and breakage of hydrogen bonds in the material, and to adjust the relative proportion of the components to indirectly control the hydrogen content of the capacitor dielectric material may be recognized after the improvements of the present invention have been understood.

Presently preferred embodiments of the invention and its improvements have been described with a degree of particularity. This description has been made by way of preferred example. It should be understood that the scope of the present invention is defined by the following claims, and should not be unnecessarily limited by the detailed description of the preferred embodiments set forth above.

What is claimed is:

1. A method of fabricating a capacitor dielectric material in a capacitor, comprising the steps of:

forming the capacitor dielectric material to contain hydrogen and adjusting a composition of the capacitor dielectric material by controlling a stoichiometry of the capacitor dielectric material in order to adjust an amount of the hydrogen contained in the capacitor dielectric material and to obtain predetermined electrical or functional characteristics of the capacitor, by forming the capacitor dielectric material from substances including silicon, nitrogen and hydrogen, forming the capacitor dielectric material to include hydrogen bonds therein by depositing the substances by using plasma enhanced chemical vapor deposition, breaking a predetermined number of the hydrogen bonds to the capacitor dielectric material by ionic bombardment to allow the hydrogen from the broken bonds to escape from the capacitor dielectric material, controlling the power of the plasma enhanced chemical vapor deposition to establish the extent of the ion bombardment, and controlling the amount of the hydrogen remaining in the formed capacitor dielectric material by controlling the power of the plasma enhanced chemical vapor deposition.

2. A method of fabricating a capacitor dielectric material in a capacitor, comprising the steps of:

forming the capacitor dielectric material to contain hydrogen and adjusting a composition of the capacitor dielectric material by controlling a stoichiometry of the capacitor dielectric material in order to adjust an amount of the hydrogen contained in the capacitor dielectric material and to obtain predetermined electrical or functional characteristics of the capacitor, by forming the capacitor dielectric material from substances including silicon, nitrogen and hydrogen, forming the capacitor dielectric material to have hydrogen bonds from the substances, breaking hydrogen bonds to the capacitor dielectric material by applying at least one thermal cycle of temperature elevation and temperature reduction to the capacitor dielectric material to allow the hydrogen from the broken bonds to escape from the capacitor dielectric material, and controlling the amount of the hydrogen in the formed capacitor dielectric material by controlling the numbers and extent of thermal cycles applied to the capacitor dielectric material.

3. A method of fabricating a capacitor dielectric material, comprising the steps of:

forming the capacitor dielectric material from substances including one substance having the capability to promote ionic conduction in the capacitor dielectric material, depositing the substances by plasma enhanced chemical vapor deposition to form the capacitor dielectric material, breaking bonds of the one substance to the capacitor dielectric material by ionic bombardment during the plasma enhanced chemical vapor deposition to allow the first substance from the broken bonds to escape the capacitor dielectric material, and controlling the amount of the one substance in the formed capacitor dielectric material by controlling the power of the plasma enhanced chemical vapor deposition to control the extent of breaking of the bonds of the one substance.

4. A method as defined in claim 3 wherein the one substance is hydrogen.

5. A method as defined in claim 4 wherein the capacitor dielectric material is one of silicon nitride or silicon oxynitride.

6. A method of fabricating a capacitor dielectric material, comprising the steps of:

forming the capacitor dielectric material from substances including one substance having the capability to promote ionic conduction in the capacitor dielectric material, breaking bands of the one substance to the capacitor dielectric material by applying at least one thermal cycle of temperature elevation and temperature reduction of the capacitor dielectric material, and controlling the amount of the one substance in the formed capacitor dielectric material by controlling the number and extent of the applications of thermal cycles to the capacitor dielectric material.

7. A method as defined in claim 6 wherein the one substance is hydrogen.

8. A method as defined in claim 7 wherein the capacitor dielectric material comprises silicon dioxide.

* * * * *